US006938328B2

(12) United States Patent
Mehdianpour et al.

(10) Patent No.: US 6,938,328 B2
(45) Date of Patent: Sep. 6, 2005

(54) DEVICE FOR FITTING SUBSTRATES WITH ELECTRIC COMPONENTS

(75) Inventors: Mohammad Mehdianpour, Munich (DE); Ralf Schulz, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 27 days.

(21) Appl. No.: 10/296,177

(22) PCT Filed: May 23, 2001

(86) PCT No.: PCT/DE01/01981

§ 371 (c)(1), (2), (4) Date: Nov. 22, 2002

(87) PCT Pub. No.: WO01/91532

PCT Pub. Date: Nov. 29, 2001

(65) Prior Publication Data

US 2003/0115744 A1 Jun. 26, 2003

(30) Foreign Application Priority Data

May 23, 2000 (DE) ........................................ 100 25 443

(51) Int. Cl.[7] ................................................ B23P 19/00

(52) U.S. Cl. ............................ 29/739; 29/740; 29/742; 29/759; 29/832; 29/33 P; 198/346.2

(58) Field of Search .................. 29/712, 743, DIG. 44, 29/832, 739, 742, 759, 771, 783, 822; 198/571, 341; 294/64.1, 2; 414/737, 752

(56) References Cited

U.S. PATENT DOCUMENTS

| | | | | | |
|---|---|---|---|---|---|
| 5,203,061 | A | * | 4/1993 | Hamada | 29/33 M |
| 5,711,065 | A | * | 1/1998 | Asai et al. | 29/740 |
| 5,778,525 | A | | 7/1998 | Hata et al. | |
| 5,806,174 | A | * | 9/1998 | Itoh | 29/740 |
| 5,994,799 | A | * | 11/1999 | Mehdianpour | 310/12 |
| 6,568,069 | B1 | * | 5/2003 | Melf et al. | 29/740 |

FOREIGN PATENT DOCUMENTS

| | | |
|---|---|---|
| WO | 9837744 | 8/1998 |

* cited by examiner

*Primary Examiner*—Minh Trinh
(74) *Attorney, Agent, or Firm*—Harness, Dickey & Pierce, P.L.C.

(57) ABSTRACT

A device for fitting substrates with electric components includes a stationary carrier supporting a positioning device. The carrier is arranged above at least two fitting stations that are located one after the other in a conveying direction. A chassis of the device includes end supports and central supports that are connected to the carrier.

28 Claims, 1 Drawing Sheet

DEVICE FOR FITTING SUBSTRATES WITH ELECTRIC COMPONENTS

This application is the national phase under 35 U.S.C. § 371 of PCT International Application No. PCT/DE01/01981 which has an International filing date of May 23, 2001, which designated the United States of America and which claims priority on German Patent Application number DE 100 25 443.8 filed May 23, 2000, the entire contents of which are hereby incorporated herein by reference.

FIELD OF THE INVENTION

The invention generally relates to a device for fitting substrates with electric components. Preferably, the device includes at least one positioning device for a fitting head which can be moved in two coordinate directions for handling the components.

BACKGROUND OF THE INVENTION

A device has been disclosed, for example, by WO 9837744 A1. According to that document, the device has a linear transport having two fitting stations for the substrates. Between the two fitting stations, a beam-like carrier extends transversely to the transport direction of the substrates. Attached to the carrier on both sides are X-Y positioning devices which cover the fitting stations and the collecting points for the components.

The positioning device comprises a longitudinal guide fixed to the carrier and provided with magnetic parts, along which an upright positioning arm provided with a coil part can be moved, on which a fitting head for handling the components can be moved. The positioning arm, anchored on one side, has a relatively great free length. Rapid acceleration processes and in particular braking processes lead to oscillations in the positioning arm, which are disruptive in particular when the fitting head is in its end region. During each collecting or fitting operation, these oscillations must first have decayed before these operations can be carried out.

Feed modules for the components are lined up on both sides of the transport path in the direction of the positioning arms. Since the positioning arms must not become too long, the number of feed modules and therefore the multiplicity of components which can be provided are also limited.

SUMMARY OF THE INVENTION

An embodiment of the invention is based on an object of providing a device which, with a compact design, permits low-oscillation mounting of the fitting head.

Since the fitting head is now no longer arranged at the side of the fitting stations but above the latter, the stationary longitudinal guide can also be arranged through the center of the travel area, so that the movable positioning arm can be driven, guided and supported in a central section, for example via an integrated linear motor. The freely projecting sections are thus distributed on both sides of the longitudinal guide and remain correspondingly short and flexurally rigid. The result of arranging the positioning axes in the central region of the fitting area is very short lever arms during fitting, which increases the fitting accuracy.

As a result of arranging the carrier above the fitting plane, no supporting structures are needed in the travel area of the fitting head, so that the feed devices for the components can be brought up close to the fitting station. Because of the beneficial mounting conditions, the travel area in the direction of the row of the feed modules can be enlarged to such an extent that a considerably greater number of feed modules can be attached.

The dimensionally stable carrier can be connected firmly to the chassis by the end supports and the central supports, so that low-oscillation transmission of the accelerating and braking forces into the chassis is possible.

An advantageous development can include wall-like central supports. As a result of their extent in the transport direction, they stiffen the support of the carrier, in particular in this direction. As a result of their oblique inclination, the carrier in the central area is also supported particularly well in the transverse direction.

The wall-like end supports can stiffen the structure transversely with respect to the transport direction of the substrates.

The relatively slim supports can be arranged at a short distance from the outer edge of the travel area, which permits correspondingly compact external dimensions.

A plate-like carrier may be particularly flexurally rigid in the direction of travel and correspondingly exhibits little oscillation. The clearances in the corner regions make access easier to the interior of the device.

The chassis may be adapted to the position of the supports. The internal corners of the cross-like structure serve to accommodate feed modules for the components to be provided.

A low-oscillation casting may be produced cost-effectively.

Pneumatic units or units for power supply, for example, can be inserted into the hollow basic body.

The cavity in the basic body, extending underneath the conveying path, can be used for the installation of an additional transport path, on which substrates can be locked past the fitting stations belonging to the device.

A plate-like carrier may include an advantage that different positioning devices can be mounted in a different configuration. For instance, the fixed longitudinal axis of the positioning device can be oriented parallel to the conveying direction, with the positioning arm covering both feed areas for the components.

Further, it is also possible to arrange the fixed longitudinal guide transversely with respect to the conveying direction and above the fitting station, as a result of which the positioning arms can be kept shorter. Arranging two positioning arms on the common longitudinal guide allows for the fitting performance to be increased considerably, by the two positioning devices alternately collecting the components and placing them on the substrate.

The operating and control devices can be arranged to be easily accessible in a close association with the positioning devices.

BRIEF DESCRIPTION OF THE DRAWINGS

The invention will be explained in more detail in the following text using exemplary embodiments illustrated in the drawings, in which.

DETAILED DESCRIPTION OF THE PREFERRED EMBODIMENTS

Figure 1:
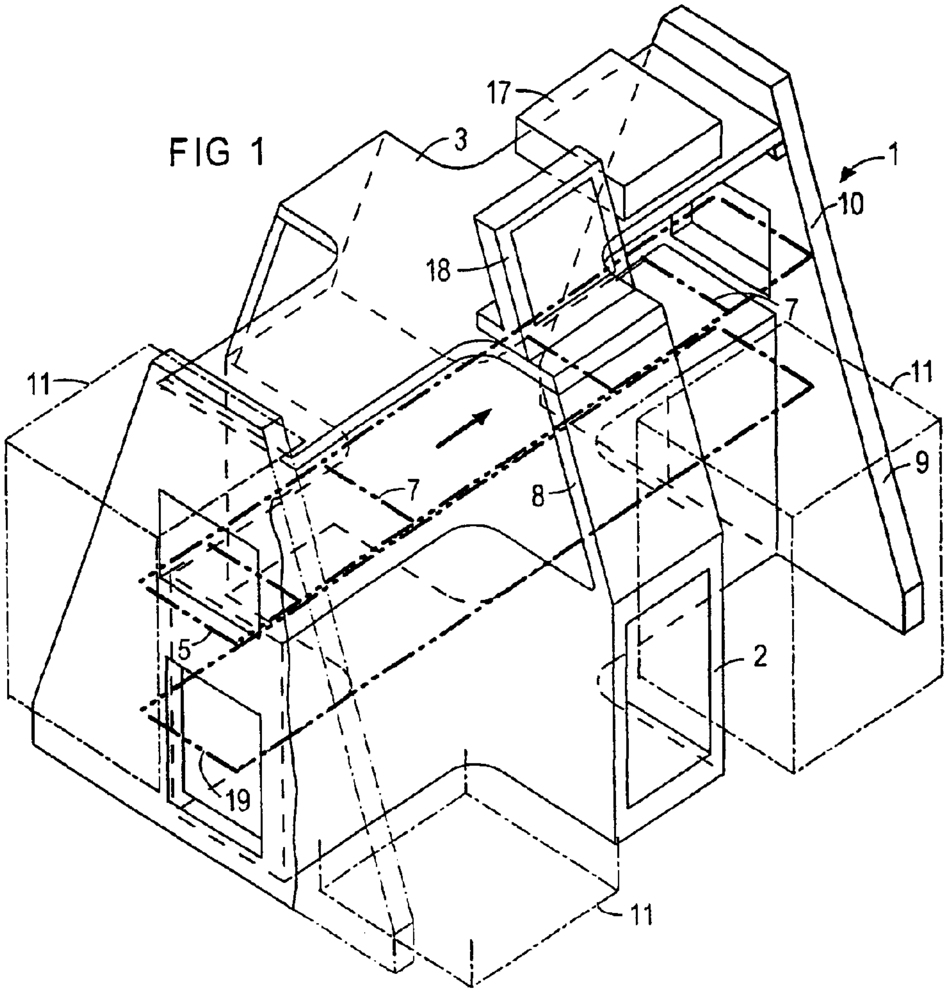
FIG. 1 shows a schematic perspective view of a device for fitting substrates with electric components.
Figure 2:
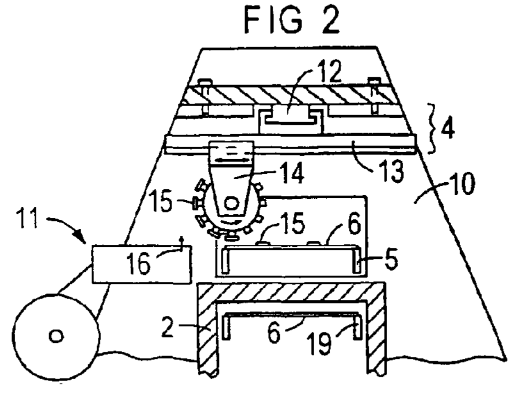
FIG. 2 shows a partial section through the device according to FIG. 1.

According to FIGS. 1 and 2, a chassis 1 of a device for fitting substrates 6 with electric components 15 includes a cast basic body 2 and a plate-like carrier 3 which is fixed thereto and on which an X-Y positioning device 4 is mounted. Above the basic body 2, a conveying path 5 for the substrates 6 is led through the device, it being possible for the substrates 6 to be fitted with the components in fitting stations 7 of the conveying path 5.

In plan view, the basic body 2 has a cross-like structure, in which a main leg extends parallel to the conveying path 5 and underneath the latter. A central leg extends transversely with respect to the transport direction in the central area of the main leg. At its ends, wall-like central supports 8 projecting upward and obliquely with respect to each other are cast on for the carrier 3. Provided at the ends of the main legs are end walls 9 which are attached in one piece and which, above the basic body 2, are widened to form end supports 10 for the carrier 3. Arranged in the corner regions between the legs of the basic body 2 are spaces for feed devices 11 for the components to be fitted. The upper sides of the feed devices 11 arc at the same vertical level as the substrate 6.

The plate-like carrier 3 is arranged at a distance above the conveying path 5. Mounted on its underside is the positioning device 4, which includes a longitudinal guide 12 which is fixed to the underside of the carrier 3 and extends in the conveying direction, and a positioning arm 13 which is transverse thereto and which is detachably mounted in the longitudinal guide 12. The latter is, for example, provided with magnetic parts which, together with a coil part belonging to the positioning arm 13, form a linear motor which drives the positioning arm.

On the underside of the positioning arm, a turret-like fitting head 14 is detachably mounted, using which the components 15 can be transported from collecting stations 16 of the feed devices 11 to their placement locations on the substrate. The central supports 8 are so wide and flexurally rigid in the conveying direction that they effectively prevent oscillations caused by the movement of the positioning arm. Pulses triggered in the transverse direction by the movement of the fitting head are effectively prevented by the end supports. In order to achieve the highest possible fitting performance, it is expedient to assign a dedicated positioning device 4 for each fitting station.

Provided on the upper side of the carrier 3 are spaces for auxiliary devices, for example in the form of a control device 17 and a display 18. The basic body 2 is formed as a cast hollow body, through whose main leg an additional transport path 19 for the substrates 6 is led. This conveying path is used, for example, to lock substrates past the fitting stations. The cavities in the central secondary legs can be used, for example, to accommodate power supply units, pneumatic equipment or further control devices.

Figure 3:
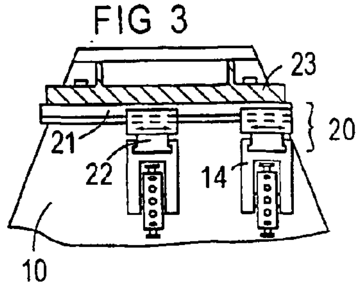
FIG. 3 shows a partial section through a modified device according to FIG. 1.

The device according to FIG. 3 differs from that according to FIG. 2 in the arrangement of the positioning axes. The modified longitudinal guides 21 here extend transversely with respect to the conveying direction of the substrates over each of the fitting stations and are fixed to a modified carrier 23 reinforced by ribs. On the longitudinal guide 21, two modified positioning arms 22 each having one of the fitting heads 14 can be moved. These form two positioning devices 20, which can alternately collect components and place them on the substrate, as a result of which the fitting performance is increased considerably.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for fitting substrates with electric components, the substrates being transportable in a conveying direction through the device on a conveying path, the device comprising:

at least two fitting stations located one after another in the conveying direction;

a positioning device for a fitting head, movable in two directions for handling the electric components; and a stationary carrier supporting the positioning device;

wherein the carrier extends in one piece over the at least two fitting stations, has a longitudinal axis that extends in the conveying direction, and is held by vertical end supports of a chassis;

wherein the positioning device is arranged on an underside of the carrier; and wherein the carrier is fixed to central supports of the chassis between the at least two fitting stations on both sides of a positioning area of the fitting head.

2. The device as claimed in claim 1, wherein the central supports are inclined obliquely upward with respect to one another.

3. The device as claimed in claim 1, wherein the end supports extend at right angles to the conveying direction.

4. The device as claimed in claim 1, wherein the carrier is detachably fastened to the end supports and the central supports; and wherein recesses are provided in corner regions of the carrier.

5. The device as claimed in claim 1, wherein the chassis includes a basic body with ends that are attached to the end supports and the central supports.

6. The device as claimed in claim 5, wherein the basic body, the end supports, and the central supports are formed as a single-piece casting.

7. The device as claimed in claim 6, wherein the basic body includes holders for auxiliary equipment.

8. The device as claimed in claim 7, wherein a transport path for the substrates is insertable into the basic body, underneath the conveying path.

9. The device as claimed in claim 1, wherein mounting spaces for a plurality of the positioning devices are provided on the carrier.

10. The device as claimed in claim 9, wherein spaces for feed devices for the electric components are arranged on both sides of the conveying path wherein the positioning device is arranged above the at least two fitting stations;

wherein the positioning device is formed by a longitudinal guide fixed to the carrier and a positioning arm extends transversely to the longitudinal guide;

wherein the longitudinal guide extends in a center over a fitting area in the conveying direction; and wherein the positioning arm projects on both sides of the longitudinal guide.

11. The device as claimed in claim 9, wherein two of the positioning devices having two of the fitting heads are respectively provided above the at least two fitting stations;

wherein the longitudinal guide extends transversely to the conveying direction; and wherein two of the positioning arms are movable on the longitudinal guide that is common to both positioning devices.

12. The device as claimed in claim 1, wherein spaces for at least one of operating and auxiliary electronic devices are provided on an upper side of the carrier.

13. The device as claimed in claim 2, wherein the end supports extend at right angles to the conveying direction.

14. The device as claimed in claim 2, wherein the carrier is detachably fastened to the end supports and the central supports; and wherein recesses are provided in corner regions of the carrier.

15. The device as claimed in claim 2, wherein the chassis includes a basic body with ends that are attached to the end supports and the central supports.

16. The device as claimed in claim 15, wherein the basic body, the end supports, and the central supports are formed as a single-piece casting.

17. The device as claimed in claim 16, wherein the basic body includes holders for auxiliary equipment.

18. The device as claimed in claim 17, wherein a transport path for the substrates is insertable into the basic body, underneath the conveying path.

19. The device as claimed in claim 2, wherein mounting spaces for a plurality of the positioning devices are provided on the carrier.

20. The device as claimed in claim 19, wherein spaces for feed devices for the electric components are arranged on both sides of the conveying path;

wherein the positioning device is arranged above the at least two fitting stations;

wherein the positioning device is formed by a longitudinal guide fixed to the carrier and a positioning arm extends transversely to the longitudinal guide;

wherein the longitudinal guide extends in a center over a fitting area in the conveying direction; and wherein the positioning arm projects on both sides of the longitudinal guide.

21. The device as claimed in claim 19, wherein two of the positioning devices having two of the fitting heads are respectively provided above the at least two fitting stations;

wherein the longitudinal guide extends transversely to the conveying direction; and wherein two of the positioning arms are movable on the longitudinal guide that is common to both positioning devices.

22. The device as claimed in claim 2, wherein spaces for at least one of operating and auxiliary electronic devices are provided on an upper side of the carrier.

23. The device as claimed in claim 3, wherein the carrier is detachably fastened to the end supports and the central supports, and wherein recesses are provided in corner regions of the carrier.

24. The device as claimed in claim 3, wherein mounting spaces for a plurality of the positioning devices are provided on the carrier.

25. The device as claimed in claim 24, wherein spaces for feed devices for the electric components are arranged on both sides of the conveying path;

wherein the positioning device is arranged above the at least two fitting stations;

wherein the positioning device is formed by a longitudinal guide fixed to the carrier and a positioning arm extends transversely to the longitudinal guide;

wherein the longitudinal guide extends in a center over a fitting area in the conveying direction; and wherein the positioning arm projects on both sides of the longitudinal guide.

26. The device as claimed in claim 24, wherein two of the positioning devices having two of the fitting heads are respectively provided above the at least two fitting stations;

wherein the longitudinal guide extends transversely to the conveying direction; and wherein two of the positioning arms are movable on the longitudinal guide that is common to both positioning devices.

27. The device as claimed in claim 3, wherein the chassis includes a cross-like basic body with ends that are attached to the end supports and the central supports.

28. The device as claimed in claim 3; wherein spaces for at least one of operating and auxiliary electronic devices are provided on an upper side of the carrier.

* * * * *